United States Patent
Andritschky et al.

(10) Patent No.: US 9,890,972 B2
(45) Date of Patent: Feb. 13, 2018

(54) METHOD FOR PROVIDING A THERMAL ABSORBER

(75) Inventors: Martin Andritschky, Braga (PT); Luis Manuel Fernandes Rebouta, Braga (PT); Kaj A. Pischow, Mikkeli (FI)

(73) Assignee: Savo-Solar Oy, Mikkelo (FI)

( * ) Notice: Subject to any disclaimer, the term of this patent is extended or adjusted under 35 U.S.C. 154(b) by 1057 days.

(21) Appl. No.: 13/643,894

(22) PCT Filed: Apr. 28, 2010

(86) PCT No.: PCT/FI2010/050342
§ 371 (c)(1),
(2), (4) Date: Jan. 28, 2013

(87) PCT Pub. No.: WO2011/135152
PCT Pub. Date: Nov. 3, 2011

(65) Prior Publication Data
US 2013/0125876 A1 May 23, 2013

(51) Int. Cl.
*F24J 2/48* (2006.01)
*C23C 14/58* (2006.01)
(Continued)

(52) U.S. Cl.
CPC ........... *F24J 2/485* (2013.01); *C23C 14/0036* (2013.01); *C23C 14/024* (2013.01);
(Continued)

(58) Field of Classification Search
CPC ............. B32B 13/04; B32B 9/04; F15B 11/22
(Continued)

(56) References Cited

U.S. PATENT DOCUMENTS

| 4,442,166 A * | 4/1984 | Fan ........................ F24J 2/487 126/569 |
| 7,585,568 B2 * | 9/2009 | Barshilia ............... C23C 14/568 428/432 |

(Continued)

FOREIGN PATENT DOCUMENTS

| CN | 101344334 | | 1/2009 |
| CN | 101344334 A | * | 1/2009 |

(Continued)

OTHER PUBLICATIONS

Effect of Al content on microstructure and mechanical properties of Ti—Al—Si—N nanocpmposite coatings Li Chen a,*, Yong Du a, Ai J. Wanga, She Q. Wanga,b, Shu Z. Zhou b.*
(Continued)

*Primary Examiner* — Kenneth Rinehart
*Assistant Examiner* — Logan Jones
(74) *Attorney, Agent, or Firm* — Brian L. Stender; Patterson Thuente Pedersen, P.A.

(57) ABSTRACT

A method for providing a thermal absorber, which can be used in solar thermal collectors. The method includes a step of depositing on a substrate a first layer having a composition that comprises titanium, aluminium, nitrogen, and one of following elements: silicon, yttrium, cerium, and chromium. The method further optionally includes a step of depositing a second layer deposited on the first layer, the second layer having a composition including titanium, aluminium, nitrogen, oxygen and one of the elements of silicon, yttrium, cerium, and chromium, and a step of depositing a third layer having a composition including titanium, aluminium, silicon, nitrogen, and oxygen, the third layer being a top layer of the thermal absorber.

10 Claims, 3 Drawing Sheets

(51) Int. Cl.
*C23C 14/02* (2006.01)
*C23C 14/00* (2006.01)
*C23C 14/06* (2006.01)

(52) U.S. Cl.
CPC ...... *C23C 14/0641* (2013.01); *C23C 14/0676* (2013.01); *C23C 14/5853* (2013.01); *F24J 2/487* (2013.01); *Y02E 10/40* (2013.01)

(58) Field of Classification Search
USPC .......................................................... 606/41
See application file for complete search history.

(56) References Cited

U.S. PATENT DOCUMENTS

| | | | |
|---|---|---|---|
| 2005/0258030 A1 | 11/2005 | Finley et al. | |
| 2006/0118841 A1* | 6/2006 | Eliason | H01L 27/11502 257/295 |
| 2007/0196670 A1 | 8/2007 | Barshilia et al. | |

FOREIGN PATENT DOCUMENTS

| | | |
|---|---|---|
| JP | 2000-211931 | 2/2000 |
| WO | WO 2005/010225 A1 | 2/2005 |
| WO | WO 2005/121389 A1 | 12/2005 |

OTHER PUBLICATIONS

Barshilia, Harish C., Et al.; "Deposition and characterization of TiAlN/Si3N4 superhard nanocomposite coatings prepared by reactive direct current unbalanced magnetron sputtering"; 2006; Vacuum 81; pp. 479-488.*

Hao, Lei, Et. al.; "Preparation and thermal stability on non-vacuum high temperature solar selective absorbing coatings"; 2009; Chinese Science Bulletin; 54(8); pp. 1451-1454.*

Japanese Office Action and English Translation of Notification of Reasons for Refusal, dated Jan. 30, 2014, 9 pages.

Nose et al., "Properties of Ti—Al—Si—N Nano composite Films Prepared by Reactive Sputtering", Powder and Powder Metallurgy, Nov. 15, 2004, vol. 51, No. 11, pp. 808-814.

Chen et al., "Effect of Al content on microstructure and mechanical properties of Ti—Al—Si—N nanocomposite coatings", Int. Journal of Refractory Metals & Hard Materials 27, 2009, pp. 718-721.

Notification of Reasons for Refusal for Japanese Patent Application No. 2013-506689, dated Feb. 3, 2015, 3 pages.

Barshilia, Harish C., et al., "Deposition and characterization of TiAlN/TiAlOn/Si$_3$N$_4$ tandem absorbers prepared using reactive direct current magnetron sputtering," *Thin Solid Films*, vol. 416, pp. 6071-6078 (2008).

Rebouta, L., et al., "Oxidation resistance of (Ti,Ai,Zr,Si) N coatings in air," *Surface and Coatings Technology*, vol. 76-77, pp. 70-74 (1995).

* cited by examiner

METHOD FOR PROVIDING A THERMAL ABSORBER

PRIORITY CLAIM

The present application is a National Phase entry of PCT Application No. PCT/FI2010/050342, filed Apr. 28, 2010, the disclosure of which is hereby incorporated by reference herein in its entirety.

TECHNICAL FIELD

This application relates generally to a method for providing a thermal absorber coating.

BACKGROUND

Thermal absorber coatings, which are produced by vacuum deposition techniques on plastic or metal substrates, have a wide potential application due to their high solar absorbance in combination with a low thermal emittance at operation temperatures. Simultaneously, the coatings have good adherence on a substrate, high hardness, and corrosion resistance.

The thermal absorber coatings are widely mentioned in the literature and those are used in industrial applications mainly to harvest thermal energy from the solar radiation so that the coatings are deposited on a tubular or flat substrate, which is integrated into a solar absorber element.

Typical operation temperatures of the solar absorber element range from about 100° C. in low temperature collectors as they are found in household applications, 200° C. to 500° C. in collector elements for a production of a process heat to up to 1200° C. in solar towers for an electrical energy production.

A coating may consist in a simple black organic paint, a monolitic metallic, ceramic, or organic coating, or a multilayered optical stack. An optical performance of the coatings is expressed by an optical absorbance of the coating a in a wavelength range relevant for the solar radiation and a radiative thermal emission $\epsilon$ in a wavelength range relevant for the black body radiation at an operating temperature. The best optical performance is achieved by multilayered optical stacks. The multilayer stacks can have a value of $\alpha$>92% and a value of $\epsilon$<10% at temperatures below 200° C. (the monolitic coatings exhibit typically an emission value >10%).

One example of a commercially introduced multilayer stack consists of a layer having titanium and nitrogen (TiN), a layer having titanium, nitrogen, and oxygen ($TiN_xO_y$), and a layer having silicon and oxygen ($SiO_x$). This multilayer stack having the aforesaid layer compositions is claimed to achieve the values of $\alpha$>95% and $\epsilon$<5% with a maximum operation temperature of up to 200° C. Other solutions, primarily in an attempt to extend the operation temperature and a lifetime of a solar absorber element, show very similar coating compositions, replacing the metal in the above mentioned coatings by chromium, aluminium, niobium, and a composition of aluminium and titanium (AlTi), but the optical performance of these coatings does not improve.

The coatings degradate generally by three basic processes. Oxygen or other corrosive elements from the atmosphere corrode the top layer of the coatings, or permeate towards a second or third coating layer and cause a decoloration of the layer, generally resulting in a reduction of $\alpha$ and an increase of $\epsilon$. Secondly, elements from a substrate material, especially in the case of copper substrates, diffuse into the coating causing again the decoloration. Thirdly, during the lifetime of a thermal absorber coating, such coating is exposed to numerous thermal cycles which may cause a loss of coating adherence and spallation that results in a complete failure of a product having the coating. The third degration process is, of course, accelerated by the above-mentioned processes.

These preceding drawbacks have limited significantly the usability of the existing thermal absorbers.

SUMMARY

Therefore, features and advantages according to embodiments of the invention is to withdraw the above-mentioned draw-backs and provide a composition of a thermal absorber coating that extends the lifetime of a thermal absorber and expands the operation temperature of the thermal absorber.

According to an embodiment of the invention, a method for providing a thermal absorber comprises a step of depositing on a substrate a first layer having a composition that comprises titanium, aluminium, nitrogen, and at least one of following elements: silicon, yttrium, cerium, and chromium. The term "thermal absorber" refers to a absorber element comprising at least a coating, and the absorber element is used for absorbing a thermal radiation, especially a solar radiation.

The term "substrate" refers to any substrate to which a thermal absorber coating is provided. The substrate can be a metallic or non-metallic substrate and it can comprise, for example, aluminium, copper, stainless steel, or plastic.

According to an embodiment of the invention, a thermal absorber comprises a first layer deposited on a substrate, the first layer having a composition that comprises titanium, aluminium, nitrogen, and at least one of following elements: silicon, yttrium, cerium, and chromium.

According to an embodiment of the invention, a solar thermal collector comprises a thermal absorber comprising a first layer deposited on a substrate, the first layer having a composition that comprises titanium, aluminium, nitrogen, and at least one of following elements: silicon, yttrium, cerium, and chromium. The solar thermal collector can be, for example, a flat plate collector, evacuated tube collector, or parabolic trough or dish.

A thermal absorber coating according to embodiments of the invention improves the coating composition of a multilayered optical stack to guarantee an extended lifetime of over 20 years at application temperatures as high as 600° C. in atmospheric conditions. The improved lifetime and expanded operation temperature range is gained by the nanostructures of the layers near a substrate, i.e. the firstly and secondly deposited layers, as well as an inertness of the top layer deposited as a last layer.

Also, a thermal absorber coating according to embodiments of the invention provides a thermal and environmental stability for multilayer coatings with an excellent optical performance required for a process heat production. The optical properties can reach a value of $\alpha$>95% and a value of $\epsilon$<5% at temperature below 200° C. and the coating withstands, during its expected lifetime, more than 20000 thermal cycles between a room temperature and application temperature (up to 600° C. as mentioned earlier) without of loss of adherence. The decoloration within this 10-20 years timeframe can be described by a variation of the optical absorbance $\Delta\alpha$ and a variation of the optical emission at application temperature of $\Delta\epsilon$ with $\Delta\alpha+0.5\times\Delta\epsilon<5\%$.

The verb "to comprise" is used in this document as an open limitation that neither excludes nor requires the existence of also unrecited features. The verbs "to include" and "to have/has" are defined as to comprise.

The terms "a", "an" and "at least one", as used herein, are defined as one or more than one and the term "plurality" is defined as two or more than two.

The term "another", as used herein, is defined as at least a second or more.

The term "or" is generally employed in its sense comprising "and/or" unless the content clearly dictates otherwise.

For the above-mentioned defined verbs and terms, these definitions shall be applied, unless a different definition is given in the claims or elsewhere in this description/specification.

Finally, the features recited in depending claims are mutually freely combinable unless otherwise explicitly stated.

BRIEF DESCRIPTION OF THE DRAWINGS

Next, the preferred embodiments of the invention will be described with reference to the accompanying drawings, in which.

DETAILED DESCRIPTION

Figure 1:
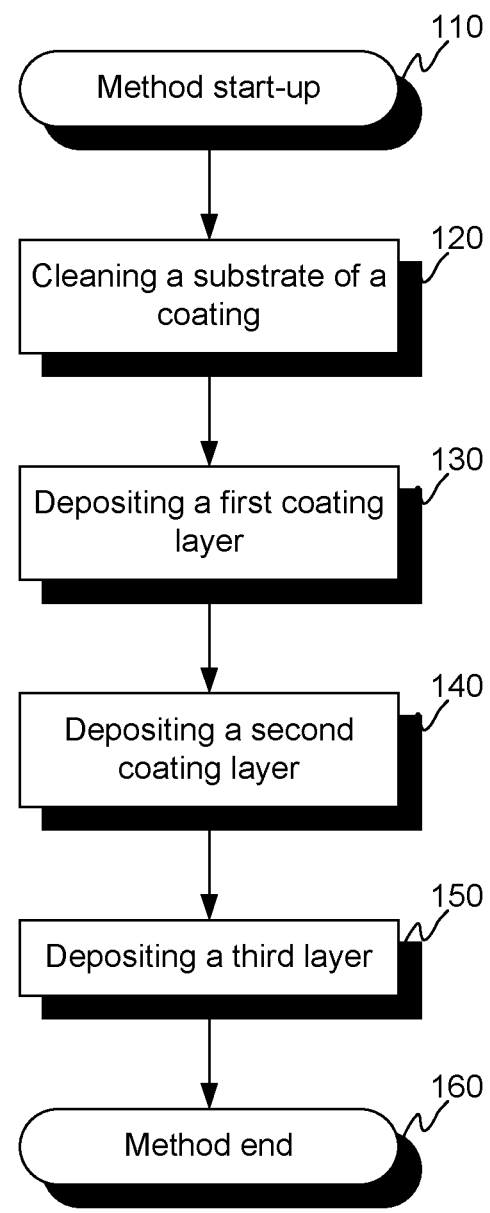
FIG. 1 illustrates an exemplary flowchart of a method according to an embodiment of the invention.

FIG. 1 illustrates a flowchart describing a method 100 for providing a multilayer thermal absorber, particularly its coating, according to the embodiment of the invention.

During the method start-up in step 110, a vacuum deposition chamber and necessary materials and equipments utilized in a layer deposition process are set up. Then, in step 120, a metallic or non-metallic substrate is cleaned mechanically and/or chemically so that it is possible to deposit the thermal absorber coating on the substrate. Naturally, these steps 110 and 120 can be performed in an opposite order or together.

In step 130 a first layer is deposited directly on the surface of the substrate and a typical substrate temperature during the deposition is, for example, 90° C.-450° C. In addition, during the deposition process, the substrate may be subjected to a negative polarization of −50 to −150 V.

According to an embodiment of the invention relating to the method disclosed in any of the previous embodiments, the first layer of a coating is deposited directly on top of the substrate.

According to an embodiment of the invention relating to the thermal absorber disclosed in any of the previous embodiments, the first layer of a coating is deposited directly on top of the substrate.

The deposited first layer, which layer thickness is 10 nm-600 nm, comprises titanium, aluminium, silicon, and nitrogen $(Ti_xAl_ySi_z)N_a$, is deposited in vacuum, for example, by magnetron sputtering from a substrate with a composition similar to the composition of the layer to be deposited or by simultaneous sputtering from the three pure element targets in a reactive atmosphere containing nitrogen. Alternatively, yttrium, cerium, or chromium can be used instead of silicon. Indices x, y, z, and a, and later on also indice b indicate a stoichiometric or non-stoichiometric composition of a coating layer. The values for x, y, z, and a can be, for example, 0.4, 0.5, 0.1, and 1.0 respectively.

According to an embodiment of the invention, and in particular according to the method$_s$ disclosed in any of the previous embodiments, the composition of the first layer comprises $(Ti_xAl_ySi_z)N_a$, where a value of x is typically between 0.3-0.5, a value of y is between 0.3-0.6, a value of z is between 0.03-0.2, and a value of a is between 0.9-1.1.

According to an embodiment of the invention relating to the thermal absorber, which is disclosed in any of the previous embodiments, the composition of the first layer comprises $(Ti_xAl_ySi_z)N_a$, where a value of x is between 0.3-0.5, a value of y is between 0.3-0.6, a value of z is between 0.03-0.2, and a value of a is between 0.9-1.1.

The function of this first layer is to absorb the incident light, to prevent or reduce a corrosion of the substrate due to environmental gases, and to prevent or reduce a diffusion of elements from the substrate into the coating.

Despite its definition or name, the "first" layer does not have to be a first layer to be deposited on the substrate but it can also be a layer which has, for example, the above described composition and which is deposited on one or more other layers provided on the surface of the substrate.

Once the first layer is on the substrate, a second layer of the coating is deposited on the surface of the first layer in step 140. The second layer comprises titanium, aluminium, silicon, nitrogen, and oxygen. Alternatively, yttrium, cerium, or chromium can be used instead of silicon.

According to an embodiment of the invention, the method, which is disclosed in any of the previous embodiments, comprises a step of depositing a second layer of the coating having a composition that comprises titanium, aluminium, nitrogen, oxygen and one of following elements: silicon, yttrium, cerium, and chromium on the first layer.

According to an embodiment of the invention the thermal absorber, which is disclosed in any of the previous embodiments, comprises a second layer of the coating, which is deposited on the first layer, having a composition that comprises titanium, aluminium, nitrogen, oxygen and one of following elements: silicon, yttrium, cerium, and chromium.

The second layer, which layer thickness is between 10 nm-150 nm, comprises titanium, aluminium, silicon, nitrogen, and oxygen $(Ti_xAl_ySi_z)N_aO_b$. Typical substrate temperatures during the deposition process are also, for example, 90° C.-450° C. The layer is deposited, for example, by magnetron sputtering from a target with a composition similar to the composition of the second layer to be deposited or by simultaneous sputtering from two or three metallic alloy targets in a reactive atmosphere containing nitrogen and oxygen. The function of this second layer is to absorb partially the incident light and to enhance the interference at selected wavelengthes.

In one embodiment the values for x, y, z, a, and b can be, for example, 0.4, 0.5, 0.1, 0.8, and 0.3 respectively.

According to an embodiment of the invention relating to the method, which is disclosed in any of the previous embodiments, the composition of the second layer deposited directly on the top of the first layer comprises $(Ti_xAl_ySi_z)N_aO_b$, where a value of x is between 0.3-0.5, a value of y is between 0.3-0.6, a value of z is between 0.03-0.2, a value of a is between 0.2-0.8, and a value of b is between 0.2-0.8.

According to an embodiment of the invention relating to the thermal absorber, which is disclosed in any of the previous embodiments, the composition of the second layer deposited directly on the top of the first layer comprises $(Ti_xAl_ySi_z)N_aO_b$, where a value of x is between 0.3-0.5, a value of y is between 0.3-0.6, a value of z is between 0.03-0.2, a value of a is between 0.2-0.8, and a value of b is between 0.2-0.8.

Then, in step 150, a top layer of the coating is deposited on the surface of the second layer. The thickness of this layer is between 50 nm-250 nm and it comprises titanium, aluminium, silicon, nitrogen, and oxygen.

According to an embodiment of the invention, the method, which is disclosed in any of the previous embodiments, comprises a step of depositing a third layer of the coating having a composition that comprises titanium, aluminium, silicon, nitrogen, and oxygen as a top layer of the thermal absorber coating.

According to an embodiment of the invention, the thermal absorber, which is disclosed in any of the previous embodiments, comprises a third layer of the coating having a composition that comprises titanium, aluminium, silicon, nitrogen, and oxygen, the third layer is deposited as a top layer of the thermal absorber coating.

Typical substrate temperatures during the deposition process of the top layer is also, for example, between room temperature and 450° C. The top layer is deposited, for example, by magnetron sputtering from a substrate with a composition similar to the composition of the top layer to be deposited or by simultaneous sputtering from several pure element targets in a reactive atmosphere containing nitrogen and oxygen. The function of the third layer is to serve as an antireflection layer in the optical multilayer stack and it may isolate the coating from the environmental gases.

According to an embodiment of the invention relating to the method, which is disclosed in any of the previous embodiments, the composition of the third layer deposited directly on the top of the second layer comprises $(Ti_xAl_ySi_z)N_aO_b$, where a value of x is between 0-0.2, a value of y is between 0-0.2, a value of z is between 0-1, a value of a is between 0-2, and a value of b is between 0-2.

According to an embodiment of the invention relating to the thermal absorber, which is disclosed in any of the previous embodiments, the composition of the third layer deposited directly on the top of the second layer comprises $(Ti_xAl_ySi_z)N_aO_b$, where a value of x is between 0-0.2, a value of y is between 0-0.2, a value of z is between 0-1, a value of a is between 0-2, and a value of b is between 0-2.

The layers are deposited on the substrate by Physical Vapor Deposition process, for example, by using a conventional magnetron sputtering, high power impulse magnetron sputtering, Atomic Layer Deposition, Pulsed Laser Deposition, or Physically Enhanced Chemical Vapor Deposition. It is not necessary to use the same technique for each layer, but it is also possible to deposit part of the layers by using one process and other layer(s) by means of another process.

According to an embodiment of the invention relating to the method, which is disclosed in any of the previous embodiments, the first layer, second layer, or third layer is deposited on the substrate by a magnetron sputtering process, a high power impulse magnetron sputtering process, an atomic layer deposition process, a pulsed laser deposition process, or a physically enhanced chemical vapor deposition process.

According to an embodiment of the invention relating to the thermal absorber, which is disclosed in any of the previous embodiments, the first layer, second layer, or third layer is deposited on the substrate by a magnetron sputtering process, a high power impulse magnetron sputtering process, an atomic layer deposition process, a pulsed laser deposition process, or a physically enhanced chemical vapor deposition process.

Finally, when the deposition process has ended, the absorber comprising the substrate and provided coating is removed from the deposition chamber and apparatus, and the method 100 ends in step 160.

Figure 2:
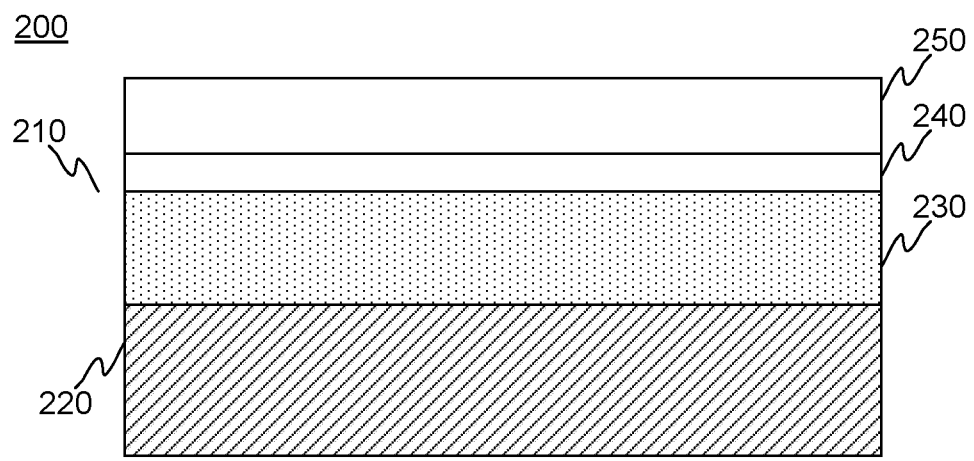
FIG. 2 illustrates an exemplary view of a thermal absorber coating according to an embodiment of the invention.

Referring to FIG. 2, a cross-section view of a thermal absorber coating 210 on a substrate 220 is illustrated. The multilayer optical coating structure 210 comprises a first layer 230 that is deposited directly on a surface of the substrate in order to absorb light and hinder a diffusion of elements from the substrate 220 towards the coating 210 and from an environment towards said substrate 220. A second layer 240 is deposited on the first layer 230 for absorbing partially an incident light and enhancing interference at selected wavelengths. A third layer 250 as a top layer of the coating is provided on the second layer 240 in order to isolate partially the coating 210 from the environmental gases and serve as an antireflection layer. It is possible to design a thermal absorber so that it is the first layer that prevents the corrosion of the substrate or, alternatively, the thermal absorber can be designed so that the third layer 250 provides the prevention of the corrosion of the substrate.

Figure 3:
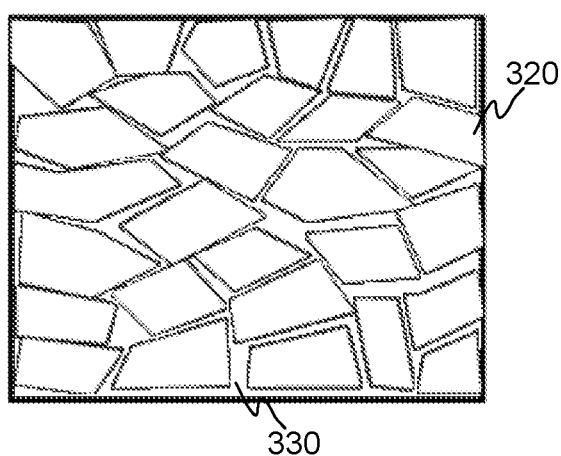
FIG. 3 illustrates a detailed exemplary view of a first layer of a thermal absorber coating according to an embodiment of the invention.

FIG. 3 represents a nanostructure of a first layer 310 that is deposited on a metallic or non-metallic substrate, whereupon this composition layer 310 comprises titanium, aluminium, silicon, and nitrogen, and it acts as a diffusion barrier.

The first layer 310 deposited, for example, by magnetron sputtering in vacuum comprises a dense structure, wherein TiAlSiN crystallites 320 are dispersed in a $Si_3N_4$ matrix 330. The first layer 310, which is characterized by a high hardness, shows very low diffusability by most foreign elements and a high optical absorbance. The function of the layer 310 is to absorb the incident light and hinder a diffusion of elements from the substrate towards the coating or from the environment towards the substrate as mentioned before.

According to an embodiment of the invention relating to the method, which is disclosed in any of the previous embodiments, the composition of the first layer comprises TiAlN crystallites with $Si_3N_4$ forming an amorphous matrix, and the first layer provides a diffusion barrier against elements of the substrate.

According to an embodiment of the invention relating to the thermal absorber, which is disclosed in any of the previous embodiments, the composition of the first layer comprises TiAlN crystallites with $Si_3N_4$ forming an amorphous matrix, and the first layer provides a diffusion barrier against elements of the substrate.

In one embodiment of the invention, a substrate is a flat or curved copper, aluminium, or stainless steel foil, or copper, aluminium, or stainless steel tube. The metallic substrate is mechanically and/or chemically cleaned before the coating process. The deposition of the first layer is performed by magnetron sputtering in a reactive atmosphere from pure element targets in vacuum at a temperature that is between 200° C.-350° C. The resulted first $Ti_xAl_ySi_zN_a$ layer has a layer thickness between 10 nm-100 nm and the composition, where a value of x is 0.44, a value of y is 0.44, a value of z in the composition is 0.12, and value of a is 1.0. Second and third layers are also deposited by magnetron sputtering, and a thickness of the second layer is 10 nm-150 nm and a third layer thickness between 80 nm-250 nm.

In another embodiment of the invention, a substrate comprises a flat or curved copper or stainless steel foil, or copper or stainless steel tube. The metallic substrate is also mechanically and/or chemically cleaned before the coating. The coating layer is deposited in vacuum similarly to the previous embodiment, but with a thickness between 200 nm-800 nm. The resulted $Ti_xAl_ySi_zN_a$ layer has a layer thickness between 10 nm-100 nm and the composition, where a value of x is 0.24, a value of y is 0.64, a value of z is 0.12, and a value of a in the composition is 1.0. After depositing the first coating layer on the selected substrate, the coated substrate is exposed to a controlled atmosphere, rich in oxygen, at temperatures between 750° C.-900° C. for a time period between 5-300 minutes. During this thermal treatment that is a simple and economic procedure applicable to three dimensional substrates two additional layers, i.e. a second and third layer, are formed. The second layer is a conversion layer that marks a gradual decrease of a nitrogen content from the first layer to the third (top) layer. This gradual decrease is accompanied by a gradual increase of an oxygen content from the first layer to the third layer. Simultaneously, a metal content of layer changes, compared to the first layer. The third layer comprises a very dense dielectric oxide, relatively rich in $Al_2O_3$.

Figure 4:
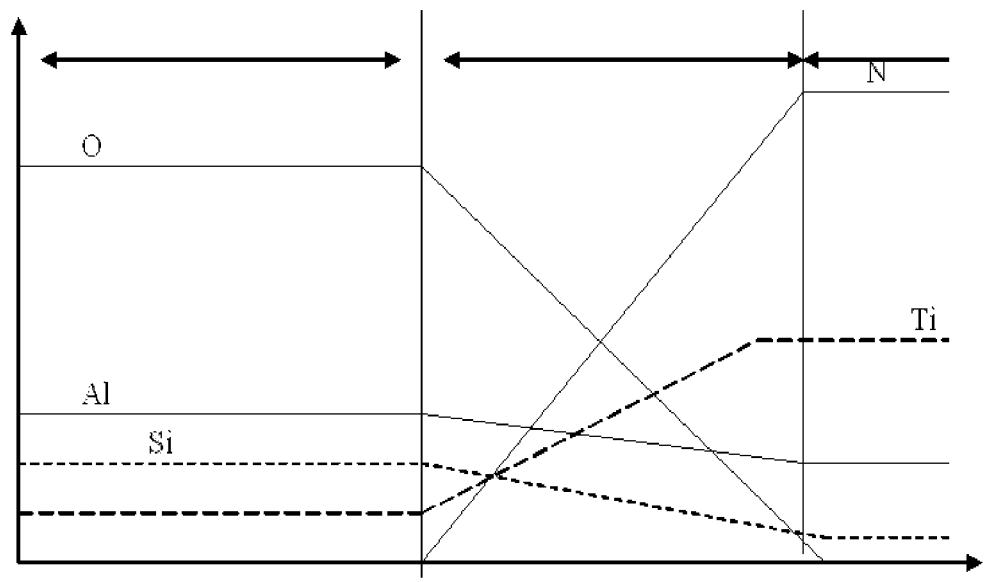
FIG. 4 illustrates an exemplary view of a distribution of an elemental composition according to an embodiment of the invention.

The general trend of an elemental composition distribution within the heat treated absorber coating is described in distribution FIG. 4. The complete stack comprising the three layers has a similar composition as the multilayer stack illustrated in FIGS. 1 and 2, but with a continuous transition between the individual layers. A horizontal axis describes the absorber coating starting from the top surface of the coating to the surface of the substrate and a vertical axis defines a composition distribution inside the layers.

Yet in another embodiment of the invention, a substrate is a flat or curved plastic foil or plastic tube that is mechanically and/or chemically cleaned before a coating process. The thickness of a first layer is in this embodiment between 50 nm-100 nm and the value of z in the composition is between 0.05 and 0.01. A deposition temperature is chosen at 90° C., and a second and third layer are deposited by magnetron sputtering so that a second layer thickness is 50 nm-150 nm and a third layer thickness is between 100 nm-200 nm. During the deposition of each layer the substrate is exposed to an additional or intrinsic ion bombardment that can be achieved by high power impulse magnetron sputtering.

Figure 5:
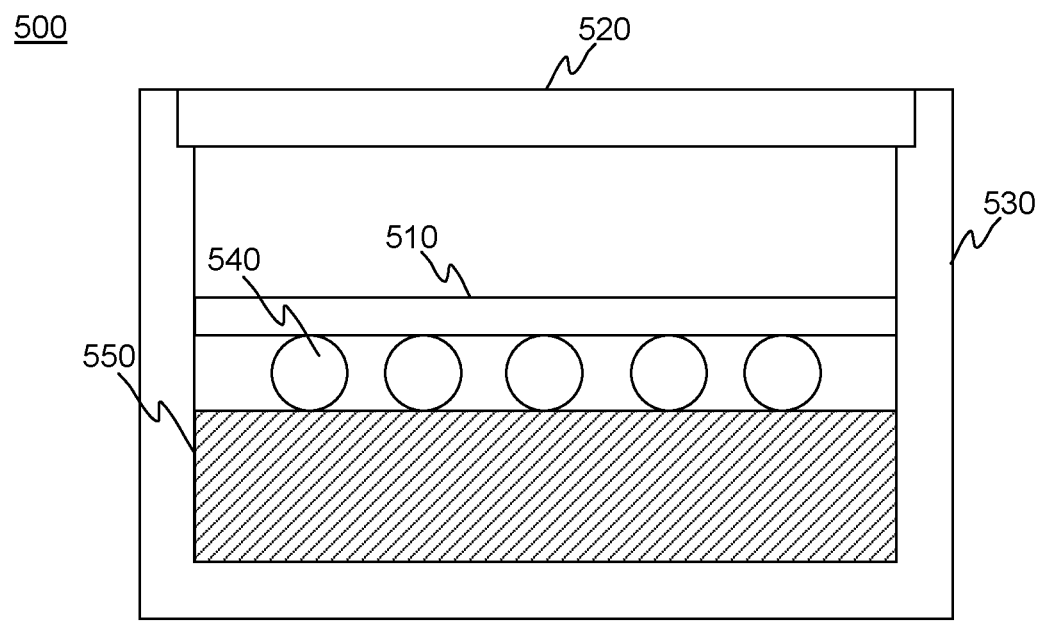
FIG. 5 illustrates an exemplary view of a solar thermal collector according to an embodiment of the invention.

FIG. 5, for one, presents a cross-section of a solar thermal collector 500 configured to collect and absorb a solar radiation. The solar thermal collector 500 comprises a thermal absorber 510 that comprises an absorber coating according to an embodiment of the invention.

According to an embodiment of the invention relating to the solar thermal collector, which is disclosed in any of the previous embodiments, the first layer of a coating is deposited directly on top of the substrate.

According to an embodiment of the invention relating to the solar thermal collector, which is disclosed in any of the previous embodiments, the composition of the first layer comprises $(Ti_xAl_ySi_z)N_a$, where a value of x is between 0.3-0.5, a value of y is between 0.3-0.6, a value of z is between 0.03-0.2, and a value of a between 0.9-1.1.

According to an embodiment of the invention relating to the solar thermal collector, which is disclosed in any of the previous embodiments, the composition of the first layer comprises TiAlN crystallites with $Si_3N_4$ forming an amorphous matrix, and the first layer provides a diffusion barrier against elements of the substrate.

According to an embodiment of the invention, the solar thermal collector, which is disclosed in any of the previous embodiments, comprises a second layer of the coating, which is deposited on the first layer, having a composition that comprises titanium, aluminium, nitrogen, oxygen and one of following elements: silicon, yttrium, cerium, and chromium.

According to an embodiment of the invention relating to the solar thermal collector, which is disclosed in any of the previous embodiments, the composition of the second layer deposited directly on the top of the first layer comprises $(Ti_xAl_ySi_z)N_aO_b$, where a value of x is between 0.3-0.5, a value of y is between 0.3-0.6, value of a z is between 0.03-0.2, a value of a is between 0.2-0.8, and a value of b is between 0.2-0.8.

According to an embodiment of the invention, the solar thermal collector, which is disclosed in any of the previous embodiments, comprises a third layer of the coating having a composition that comprises titanium, aluminium, silicon, nitrogen, and oxygen, the third layer is deposited as a top layer of the thermal absorber.

According to an embodiment of the invention relating to the solar thermal collector, which is disclosed in any of the previous embodiments, the composition of the third layer deposited directly on the top of the second layer comprises $(Ti_xAl_ySi_z)N_aO_b$, where a value of x is between 0-0.2, a value of y is between 0-0.2, a value of z is between 0-1, a value of a is between 0-2, and a value of b is between 0-2.

According to an embodiment of the invention relating to the solar thermal collector, which is disclosed in any of the previous embodiments, the first layer, second layer, or third layer is deposited on the substrate by a magnetron sputtering process, a high power impulse magnetron sputtering process, an atomic layer deposition process, a pulsed laser deposition process, or a physically enhanced chemical vapor deposition process.

The flat plate-type collector 500 comprises a transparent cover 520 made of, for example, glass or polycarbonate, which is configured to allow the solar radiation to pass to the absorber element 510 and reduce a heat loss from the absorber element 510, and a collector frame 530. The cover 520 and frame 530 shelter said absorber element 510 and tubes 540 connected to the absorber element 510, wherein a heat transport fluid, for example, air, water, or antifreeze, flows so that the absorbed heat is removed from the absorber element 510. The heat transport fluid circulates through the tubes 540 and transports the resulted heat to a water tank directly in the case of water flowing in the tubes 540. On the bottom of the collar collector 500, under the tubes 540 is yet a heat insulation 550.

The invention has been now explained above with reference to the aforesaid embodiments and the several advantages of the invention have been demonstrated. It is clear that the invention is not only restricted to these embodiments, but comprises all possible embodiments within the spirit and scope of the invention thought and the following patent claims.

The invention claimed is:

1. A method for providing a thermal absorber, the method comprising:
   depositing on a surface of a substrate a first layer as a light absorbing layer and as a diffusion barrier for preventing a diffusion of elements from the substrate into a coating of the substrate;
   depositing a second layer on the first layer of the thermal absorber; and
   depositing a top layer on the second layer;

wherein the first layer belonging to the coating;

wherein the first layer has a composition comprising titanium, aluminium, silicon and nitrogen, having a first layer formula of $(Ti_xAl_ySi_z)N_a$ and TiAlN crystallites with $Si_3N_4$ forming an amorphous matrix, wherein a value of x is between 0.3-0.5, a value of y is between 0.3-0.6, a value of z is between 0.03-0.2, and a value of a between 0.9-1.1;

wherein the second layer has a composition comprising titanium, aluminium, silicon, nitrogen, and oxygen having a second layer formula of $(Ti_xAl_ySi_z)N_aO_b$, wherein a value of x is between 0.3-0.5, a value of y is between 0.3-0.6, a value of z is between 0.03-0.2, a value of a is between 0.2-0.8, and a value of b is between 0.2-0.8; and wherein the top layer has a composition comprising titanium, aluminium, silicon, nitrogen and oxygen having a top layer formula of $(Ti_xAl_ySi_z)N_aO_b$, wherein a value of x is at most 0.2, a value of y is at most 0.2, a value of z is at most 1, a value of a is at most 2, and a value of b is at most 2.

2. The method of claim 1, wherein the second layer is deposited directly on a top surface of the first layer.

3. The method of claim 1, wherein the top layer is deposited directly on a top surface of the second layer.

4. The method of claim 1, wherein the first layer, the second layer, or the top layer is deposited by a magnetron sputtering process, a high power impulse magnetron sputtering process, an atomic layer deposition process, a pulsed laser deposition process, or a physically enhanced chemical vapor deposition process.

5. A thermal absorber comprising a substrate having a first layer deposited on top of a surface of the substrate thereon as a light absorbing layer and as a diffusion barrier for preventing a diffusion of elements from the substrate into a coating of the substrate;

a second layer deposited on the first layer of the thermal absorber; and a top layer deposited on a top surface of the second layer on the thermal absorber;

wherein the first layer belonging to the coating;

wherein the first layer has a composition comprising titanium, aluminium, silicon and nitrogen, having a first layer formula of $(Ti_xAl_ySi_z)N_a$ and TiAlN crystallites with $Si_3N_4$ forming an amorphous matrix, wherein a value of x is between 0.3-0.5, a value of y is between 0.3-0.6, a value of z is between 0.03-0.2, and a value of a between 0.9-1.1;

wherein the second layer has a composition comprising titanium, aluminium, silicon, nitrogen, and oxygen having a second layer formula of $(Ti_xAl_ySi_z)N_aO_b$, wherein a value of x is between 0.3-0.5, a value of y is between 0.3-0.6, a value of z is between 0.03-0.2, a value of a is between 0.2-0.8, and a value of b is between 0.2-0.8; and wherein the top layer has a composition comprising titanium, aluminium, silicon, nitrogen and oxygen having a top layer formula of $(Ti_xAl_ySi_z)N_aO_b$, wherein a value of x is at most 0.2, a value of y is at most 0.2, a value of z is at most 1, a value of a is at most 2, and a value of b is at most 2.

6. A solar thermal collector comprising a thermal absorber, the thermal absorber comprising a substrate having:

a first layer deposited on top of a surface of the substrate thereon as a light absorbing layer and as a diffusion barrier for preventing a diffusion of elements from the substrate into a coating of the substrate;

a second layer deposited on the first layer of the thermal absorber; and a top layer deposited on a top surface of the second layer on the thermal absorber;

wherein the first layer belonging to the coating;

wherein the first layer has a composition comprising titanium, aluminium, silicon and nitrogen, having a first layer formula of $(Ti_xAl_ySi_z)N_a$ and TiAlN crystallites with $Si_3N_4$ forming an amorphous matrix, wherein a value of x is between 0.3-0.5, a value of y is between 0.3-0.6, a value of z is between 0.03-0.2, and a value of a between 0.9-1.1;

wherein the second layer has a composition comprising titanium, aluminium, silicon, nitrogen, and oxygen having a second layer formula of $(Ti_xAl_ySi_z)N_aO_b$, wherein a value of x is between 0.3-0.5, a value of y is between 0.3-0.6, a value of z is between 0.03-0.2, a value of a is between 0.2-0.8, and a value of b is between 0.2-0.8; and wherein the top layer has a composition comprising titanium, aluminium, silicon, nitrogen and oxygen having a top layer formula of $(Ti_xAl_ySi_z)N_aO_b$, wherein a value of x is at most 0.2, a value of y is at most 0.2, a value of z is at most 1, a value of a is at most 2, and a value of b is at most 2.

7. The thermal absorber of claim 5, wherein the second layer is deposited directly on a top surface of the first layer.

8. The thermal absorber of claim 5, wherein the top layer is deposited directly on a top surface of the second layer.

9. The solar thermal collector of claim 6, wherein the top layer is deposited directly on a top surface of the second layer.

10. The thermal absorber of claim 6, wherein the second layer is deposited directly on a top surface of the first layer.

* * * * *

UNITED STATES PATENT AND TRADEMARK OFFICE
CERTIFICATE OF CORRECTION

PATENT NO. : 9,890,972 B2
APPLICATION NO. : 13/643894
DATED : February 13, 2018
INVENTOR(S) : Andritschky et al.

Page 1 of 1

It is certified that error appears in the above-identified patent and that said Letters Patent is hereby corrected as shown below:

On the Title Page

Under (73) Assignee:
Delete: "Mikkelo" and insert --Mikkeli--

Signed and Sealed this
Ninth Day of July, 2019

Andrei Iancu
*Director of the United States Patent and Trademark Office*